(12) United States Patent
Chen et al.

(10) Patent No.: US 12,525,542 B2
(45) Date of Patent: Jan. 13, 2026

(54) PACKAGE STRUCTURE AND MANUFACTURING METHOD THEREOF

(71) Applicant: Unimicron Technology Corp., Taoyuan (TW)

(72) Inventors: Ying-Chu Chen, Chiayi (TW); Jeng-Ting Li, Pingtung County (TW); Chi-Hai Kuo, Taoyuan (TW); Cheng-Ta Ko, Taipei (TW); Pu-Ju Lin, Hsinchu (TW)

(73) Assignee: Unimicron Technology Corp., Taoyuan (TW)

( * ) Notice: Subject to any disclaimer, the term of this patent is extended or adjusted under 35 U.S.C. 154(b) by 724 days.

(21) Appl. No.: 17/814,527

(22) Filed: Jul. 24, 2022

(65) Prior Publication Data

US 2023/0402391 A1  Dec. 14, 2023

(30) Foreign Application Priority Data

Jun. 13, 2022 (TW) .................................. 111121803

(51) Int. Cl.
*H01L 23/538* (2006.01)
*H01L 21/48* (2006.01)
*H01L 21/56* (2006.01)
*H01L 23/29* (2006.01)

(52) U.S. Cl.
CPC ...... *H01L 23/5385* (2013.01); *H01L 21/4857* (2013.01); *H01L 21/56* (2013.01); *H01L 23/293* (2013.01); *H01L 23/5383* (2013.01)

(58) Field of Classification Search
CPC .............................. H01L 23/15; H01L 23/562
See application file for complete search history.

(56) References Cited

FOREIGN PATENT DOCUMENTS

| | | | |
|---|---|---|---|
| CN | 103936290 A | 7/2014 | |
| JP | 2011159788 A * | 8/2011 | ............. H01L 27/97 |
| TW | I701981 B | 8/2020 | |
| WO | WO-2023188849 A1 * | 10/2023 | ............. H01L 23/80 |

* cited by examiner

*Primary Examiner* — Evan G Clinton
(74) *Attorney, Agent, or Firm* — CKC & Partners Co., LLC

(57) ABSTRACT

A manufacturing method of a package structure includes: forming a redistribution layer on a top surface of a glass substrate; forming a protective layer on the top surface of the glass substrate; cutting the glass substrate and the protective layer such that the glass substrate has a cutting edge, in which a crack is formed in the cutting edge of the glass substrate; and heating the protective layer such that a portion of the protective layer flows towards a bottom surface of the glass substrate to cover the cutting edge of the glass substrate and fill the crack in the cutting edge of the glass substrate.

7 Claims, 12 Drawing Sheets

PACKAGE STRUCTURE AND MANUFACTURING METHOD THEREOF

RELATED APPLICATION

This application claims priority to Taiwan Application Serial Number 111121803, filed Jun. 13, 2022, which is herein incorporated by reference in its entirety.

BACKGROUND

Field of Invention

The present disclosure relates to a package structure and a manufacturing method of the package structure.

Description of Related Art

In general, glass substrates are usually used in mini LED and micro-LED displays, and a manufacturing process of these displays may include a step to cut the glass substrates. However, when the glass substrate is cut without a protective mechanism, a crack will be formed in cutting edge of the glass substrate because of cutting parameters or glass stress of the glass substrate, which may reduce structural stability of the glass substrate. When the glass substrate has collided during transportation or installation of LEDs (such as mini LEDs or micro-LEDs), the crack formed by the cutting process may expand and extend in the glass substrate, which may cause the glass substrate to break. Therefore, it may increase manufacturing costs and reduce a yield of these display products.

SUMMARY

An aspect of the present disclosure is related to a manufacturing method of a package structure.

According to one embodiment of the present disclosure, a package structure includes a glass substrate, a redistribution layer and a protective layer. The glass substrate has a top surface and a cutting edge adjacent to the top surface. A crack is formed in the cutting edge of the glass substrate. The redistribution layer is located on the top surface of the glass substrate. The protective layer is located on the top surface of the glass substrate. A portion of the protective layer covers the cutting edge of the glass substrate and fills the crack in the cutting edge of the glass substrate.

In one embodiment of the present disclosure, the redistribution layer and the protective layer are separated by a distance.

In one embodiment of the present disclosure, the distance is in a range from 0.5 mm to 1 mm.

In one embodiment of the present disclosure, the package structure further includes an electronic device. The electronic device is located on the redistribution layer.

In one embodiment of the present disclosure, the protective layer extends on the redistribution layer to cover the electronic device.

In one embodiment of the present disclosure, the protective layer is made of a material that includes an organic polymer.

In one embodiment of the present disclosure, the protective layer is transparent.

In one embodiment of the present disclosure, the protective layer is non-transparent.

Another aspect of the present disclosure is related to a manufacturing method of a package structure.

According to one embodiment of the present disclosure, a manufacturing method of a package structure includes: forming a redistribution layer on a top surface of a glass substrate; forming a protective layer on the top surface of the glass substrate; cutting the glass substrate and the protective layer such that the glass substrate has a cutting edge, wherein a crack is formed in the cutting edge of the glass substrate; and heating the protective layer such that a portion of the protective layer flows toward a bottom surface of the glass substrate to cover the cutting edge of the glass substrate and fill the crack in the cutting edge of the glass substrate.

In one embodiment of the present disclosure, cutting the glass substrate and the protective layer is performed by a wheel knife or a laser.

In one embodiment of the present disclosure, the protective layer is formed on the top surface of the glass substrate, and the redistribution layer and the protective layer are separated by a distance.

In one embodiment of the present disclosure, after the protective layer is heated, the method further includes disposing an electronic device on the redistribution layer.

In one embodiment of the present disclosure, before the protective layer is formed on the top surface of the glass substrate, the method further includes disposing an electronic device on the redistribution layer.

In one embodiment of the present disclosure, the protective layer is formed on the top surface of the glass substrate to cover the electronic device.

In one embodiment of the present disclosure, forming the protective layer on the top surface of the glass substrate is performed by dropper coating.

In one embodiment of the present disclosure, heating the protective layer is performed by a heat source disposed on a portion of the protective layer adjacent to the cutting edge.

In one embodiment of the present disclosure, the method further includes removing the heat source to solidify the protective layer after the protective layer covers the cut edge and fills the crack.

When the glass substrate of the package structure is cut, due to the glass stress, the crack is formed in the cutting edge of the glass substrate. However, in the embodiments of the present disclosure, the protective layer may cover the cutting edge of the glass substrate and fill the crack in the cutting edge of the glass substrate. As a result, the protective layer may prevent the crack from expanding in the glass substrate and enhance structural stability of the glass substrate, thereby reducing the cracking chance of the glass substrate. It may reduce manufacturing costs and improve a yield of these display products.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
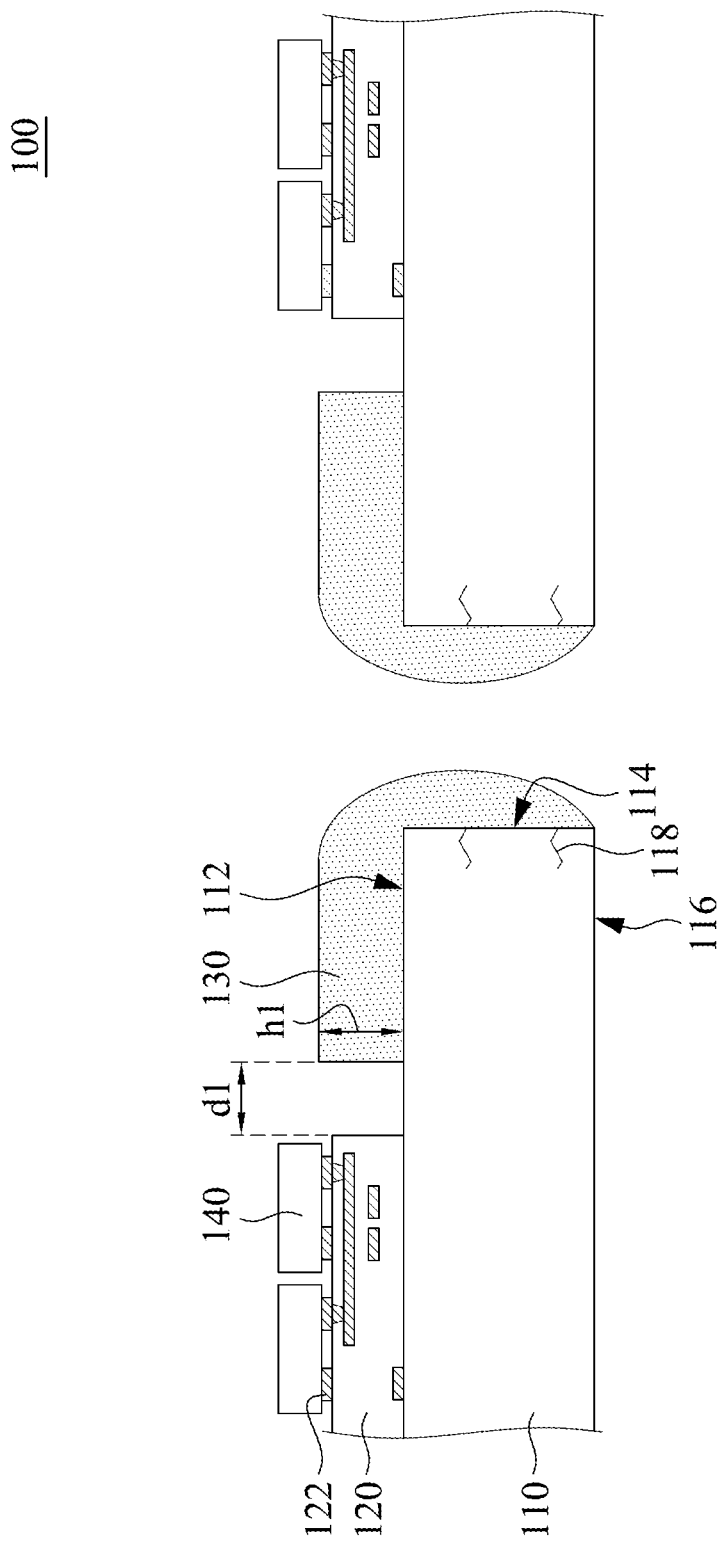
FIG. 1 illustrates a cross-sectional view of a package structure according to one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper," "front," "back" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 illustrates a cross-sectional view of a package structure 100 according to one embodiment of the present disclosure. The package structure 100 includes a glass substrate 110, a redistribution layer 120 and a protective layer 130. The glass substrate 110 of the package structure 100 has a top surface 112, a cutting edge 114 adjacent to the top surface 112, and a bottom surface 116 opposite the top surface 112. For example, the glass substrate 110 may be made of a material that includes silicon, but is not limited in this regard.

At least one crack 118 is formed in the cutting edge 114 of the glass substrate 110. The redistribution layer 120 of the package structure 100 is located on the top surface 112 of the glass substrate 110. The redistribution layer 120 may have pads 122. The protective layer 130 of the package structure 100 is located on the top surface 112 of the glass substrate 110. It is to be noted that a portion of the protective layer 130 covers the cutting edge 114 of the glass substrate 110 and fills the crack 118 in the cutting edge 114 of the glass substrate 110.

In this embodiment, the protective layer 130 may be located on a cutting lane of the glass substrate 110, and the redistribution layer 120 and the protective layer 130 may be separated by a distance d1. The distance d1 is in a range from 0.5 mm to 1 mm. In addition, the package structure 100 further includes an electronic device 140. For example, the electronic device 140 may include a chip, such as a mini LED chip or a micro-LED chip, but is not limited in this regard.

The electronic device 140 may be located on the redistribution layer 120 and electrically connected to the pads 122 of the redistribution layer 120. In this embodiment, the protective layer 130 may be made of a material that includes an organic polymer and may be a thermoplastic resin. In addition, the protective layer 130 may be non-transparent. For example, the protective layer 130 may be black such that the protective layer 130 may absorb light, which may reduce the reflection of external light by the glass substrate 110 and improve an image quality. In FIG. 1, the protective layer 130 covers the cutting edge 114 of the glass substrate 110 as an example. However, under practical applications, the cutting edge 114 around the glass substrate 110 may be all covered by the protective layer 130 to improve an overall protective effect of the protective layer 130 on the glass substrate 110. In addition, the protective layer 130 may have a height h1 according to this manufacturing process. For example, the protective layer 130 is coated on the cutting lane of the glass substrate 110 by droppers. After the protective layer 130 is cut and melted (will be described below), the height h1 of the protective layer 130 on the top surface 112 of the glass substrate 110 may be lower than a distance between a top portion of the electronic device 140 and the top surface 112 of the glass substrate 110. That is, the protective layer 130 does not cover the electronic device 140 and the redistribution layer 120.

Specifically, when the glass substrate 110 of the package structure 100 is cut, due to the glass stress, the crack 118 is formed in the cutting edge 114 of the glass substrate 110. However, the protective layer 130 may cover the cutting edge 114 of the glass substrate 110 and fill the crack 118 in the cutting edge 114 of the glass substrate 110. As a result, the protective layer 130 may prevent the crack 118 from expanding in the glass substrate 110 and enhance the structural stability of the glass substrate 110, thereby reducing the cracking chance of the glass substrate 110. It may reduce manufacturing costs and improve a yield of these display products.

It is to be noted that the connection relationship of the aforementioned elements will not be repeated. In the following description, another type of package structure will be described.

Figure 2:
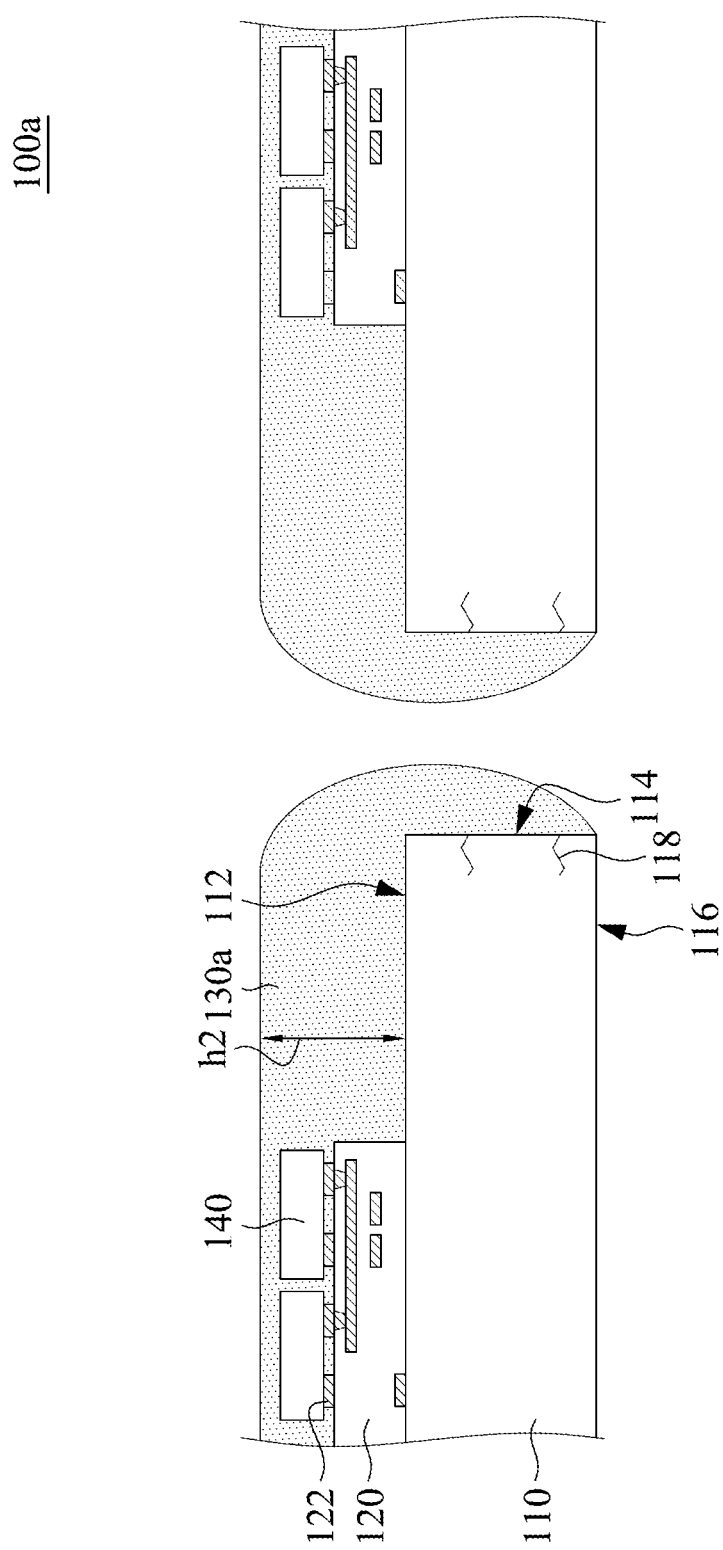
FIG. 2 illustrates a cross-sectional view of a package structure according to another embodiment of the present disclosure.

FIG. 2 illustrates a cross-sectional view of a package structure 100a according to another embodiment of the present disclosure. The package structure 100a includes the glass substrate 110, the redistribution layer 120, a protective layer 130a and the electronic device 140. The difference between the embodiment shown in FIG. 2 and the embodiment shown in FIG. 1 is that the protective layer 130a may extend on the redistribution layer 120 to cover the electronic device 140. That is to say, after the redistribution layer 120 is formed, the electronic device 140 may be disposed on the pads 122 of the redistribution layer 120, and then the protective layer 130a is formed (will be described below).

For example, the electronic device 140 may include a chip, but is not limited in this regard.

In addition, the protective layer 130a may be made of a material that includes an organic polymer, and the protective layer 130a may be transparent. The electronic device 140 may be an LED. Although the protective layer 130a extends on the redistribution layer 120 and covers the electronic device 140, the electronic device 140 will not be visually blocked, which may maintain the user's observation experience and provide a protective effect to the electronic device 140 at the same time. In addition, the protective layer 130a of the package structure 100a may prevent the crack 118 from expanding in the cutting edge 114 of the glass substrate 110, thereby enhancing a structural stability of the glass substrate 110. The crack 118 in the cutting edge 114 of the glass substrate 110 is filled by the protective layer 130a, which may reduce the cracking chance of the glass substrate 110, thereby reducing manufacturing costs and improving a yield of the package structure 100a. In FIG. 2, the protective layer 130a covers the cutting edge 114 of the glass substrate 110 as an example. However, under practical applications, the cutting edge 114 around the glass substrate 110 may be all covered by the protective layer 130a to improve a protective effect of the protective layer 130a on the glass substrate 110. In addition, the protective layer 130a may have a height h2 according to this manufacturing process. For example, the protective layer 130a is entirely coated on the glass substrate 110. After the protective layer 130a is cut and melted (will be described below), the height h2 of the protective layer 130a on the top surface 112 of the glass substrate 110 may be higher than a distance between a top portion of the electronic device 140 and the top surface 112 of the glass substrate 110, and the protective layer 130a may cover the electronic device 140 and the redistribution layer 120.

In the following description, manufacturing methods of the package structure 100 (see FIG. 1) and the package structure 100a (see FIG. 2) will be described. It is to be noted that the connection relationship of the aforementioned elements will not be repeated.

Figure 3:
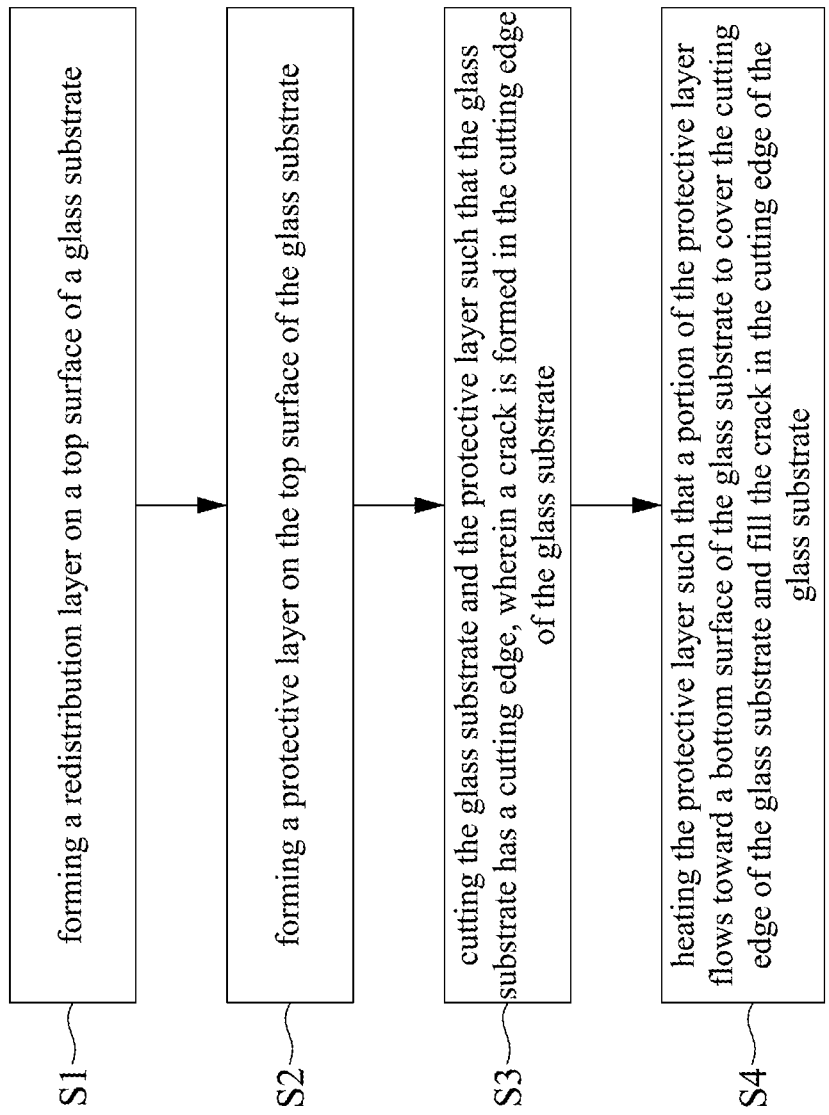
FIG. 3 illustrates a flow chart of a manufacturing method of a package structure according to one embodiment of the present disclosure.

FIG. 3 illustrates a flow chart of a manufacturing method of a package structure according to one embodiment of the present disclosure. The manufacturing method of the package structure includes steps as outlined below. In step S1, forming a redistribution layer on a top surface of a glass substrate. In step S2, forming a protective layer on the top surface of the glass substrate. In step S3, cutting the glass substrate and the protective layer such that the glass substrate has a cutting edge, wherein a crack is formed in the cutting edge of the glass substrate. In step S4, heating the protective layer such that a portion of the protective layer flows toward a bottom surface of the glass substrate to cover the cutting edge of the glass substrate and fill the crack in the cutting edge of the glass substrate. In the following description, the aforementioned steps will be described in detail.

Figure 4A:
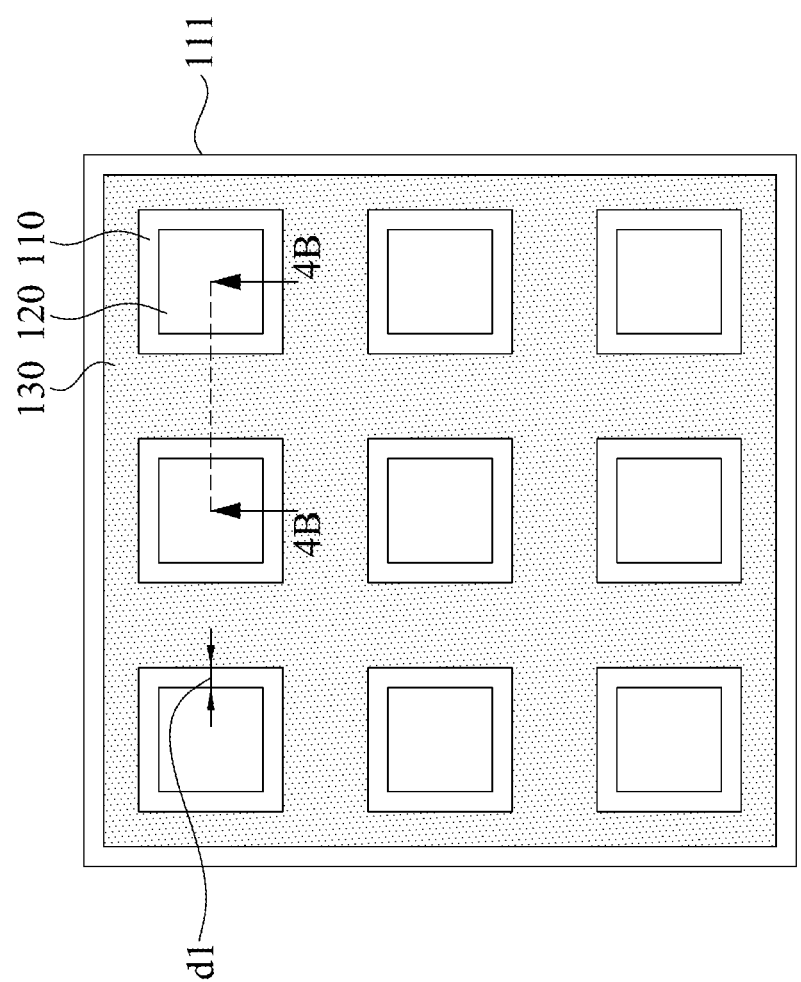
FIG. 4A illustrates a top view of a glass substrate before a cutting process is performed according to one embodiment of the present disclosure.
Figure 4B:
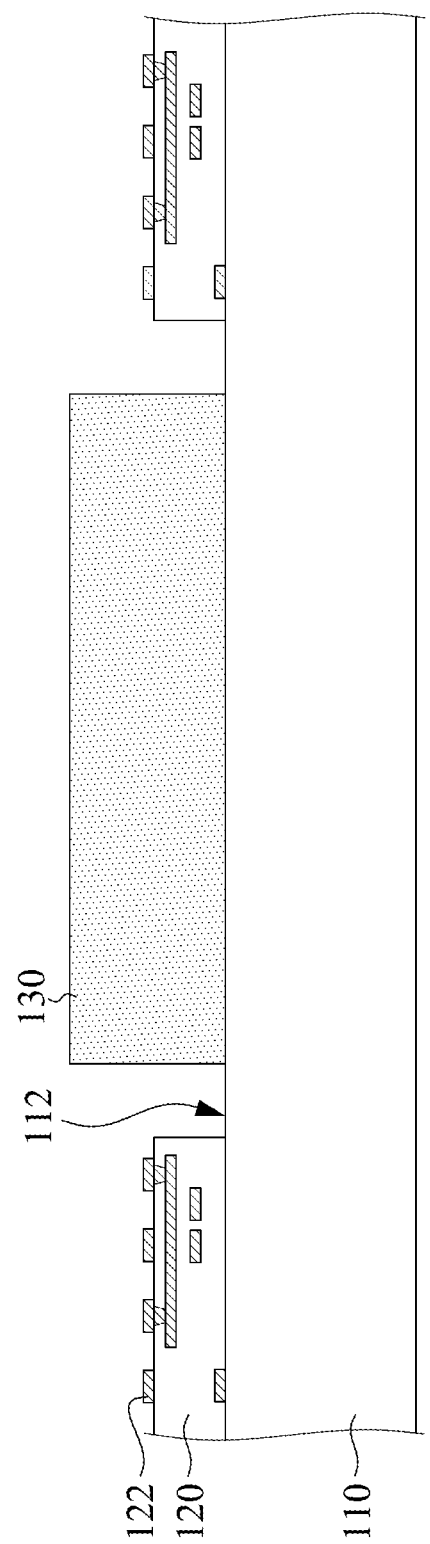
FIG. 4B illustrates a cross-sectional view of the glass substrate of FIG. 4A along line segment 4B-4B.

FIG. 4A illustrates a top view of the glass substrate 110 before a cutting process is performed according to one embodiment of the present disclosure. FIG. 4B illustrates a cross-sectional view of the glass substrate 110 of FIG. 4A along line segment 4B-4B. Referring to both FIG. 4A and FIG. 4B, the redistribution layer 120 and the protective layer 130 are located on the glass substrate 110. The distance d1 on the glass substrate 110 is located between the redistribution layer 120 and the protective layer 130. Before the glass substrate 110 is not cut, the periphery of the glass substrate 110 has an area 111. For example, the area 111 may be a portion of the cutting lane of the glass substrate 110. The manufacturing method includes forming the redistribution layer 120 on the top surface 112 of the glass substrate 110. After the redistribution layer 120 is formed, the protective layer 130 may be formed on the top surface 112 of the glass substrate 110. In some embodiments, the protective layer 130 is formed on the top surface 112 of the glass substrate 110 by dropper coating, printing, or spraying. For example, the protective layer 130 may be formed on the cutting lane of the glass substrate 110, and the redistribution layer 120 and the protective layer 130 are separated apart.

Figure 5A:
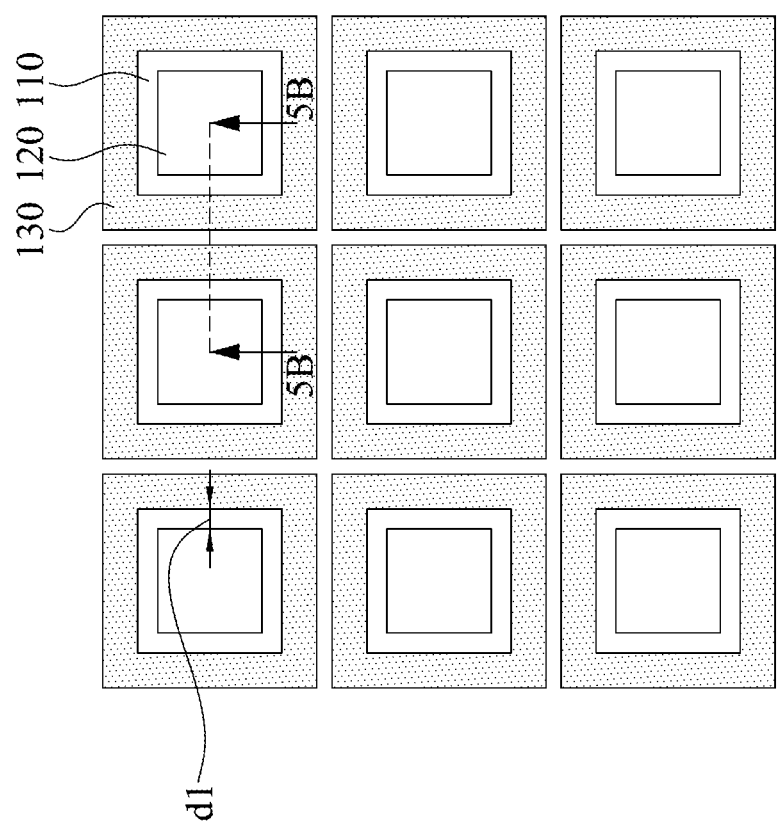
FIG. 5A illustrates a top view of the glass substrate of FIG. 4A after a cutting process is performed.
Figure 5B:
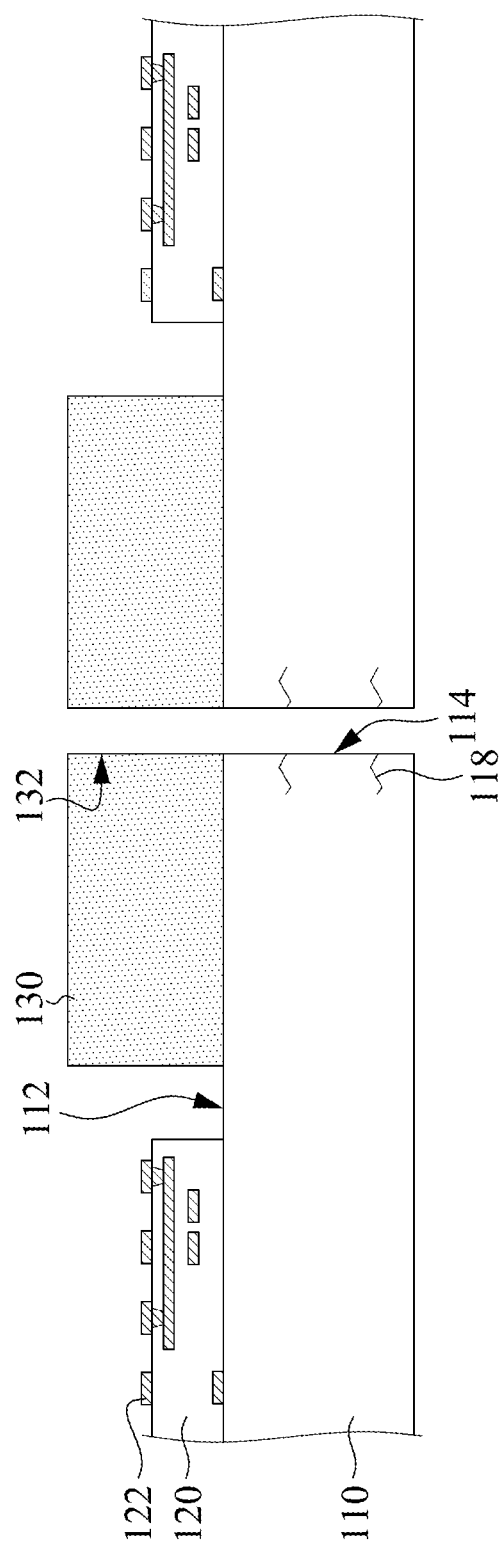
FIG. 5B illustrates a cross-sectional view of the glass substrate of FIG. 5A along line segment 5B-5B.

FIG. 5A illustrates a top view of the glass substrate 110 of FIG. 4A after a cutting process is performed. FIG. 5B illustrates a cross-sectional view of the glass substrate 110 of FIG. 5A along line segment 5B-5B. Referring to both FIG. 5A and FIG. 5B, after the protective layer 130 is formed on the top surface 112 of the glass substrate 110, the glass substrate 110 and the protective layer 130 are cut such that the glass substrate 110 has the cutting edge 114 and the protective layer 130 has a cutting edge 132. In some embodiments, the glass substrate 110, the area 111 (see FIG. 4A), and the protective layer 130 are cut by a wheel knife or a laser. When the glass substrate 110 is cut by the wheel knife or the laser, due to the glass stress or cutting parameters of the glass substrate 110, the crack 118 is formed in the cutting edge 114 of the glass substrate 110. As shown in FIG. 5A, the glass substrate 110 may be covered by the protective layer 130 all around to improve a protective effect of the protective layer 130 on the glass substrate 110 and to reduce the cracking chance of the glass substrate 110.

Figure 6:
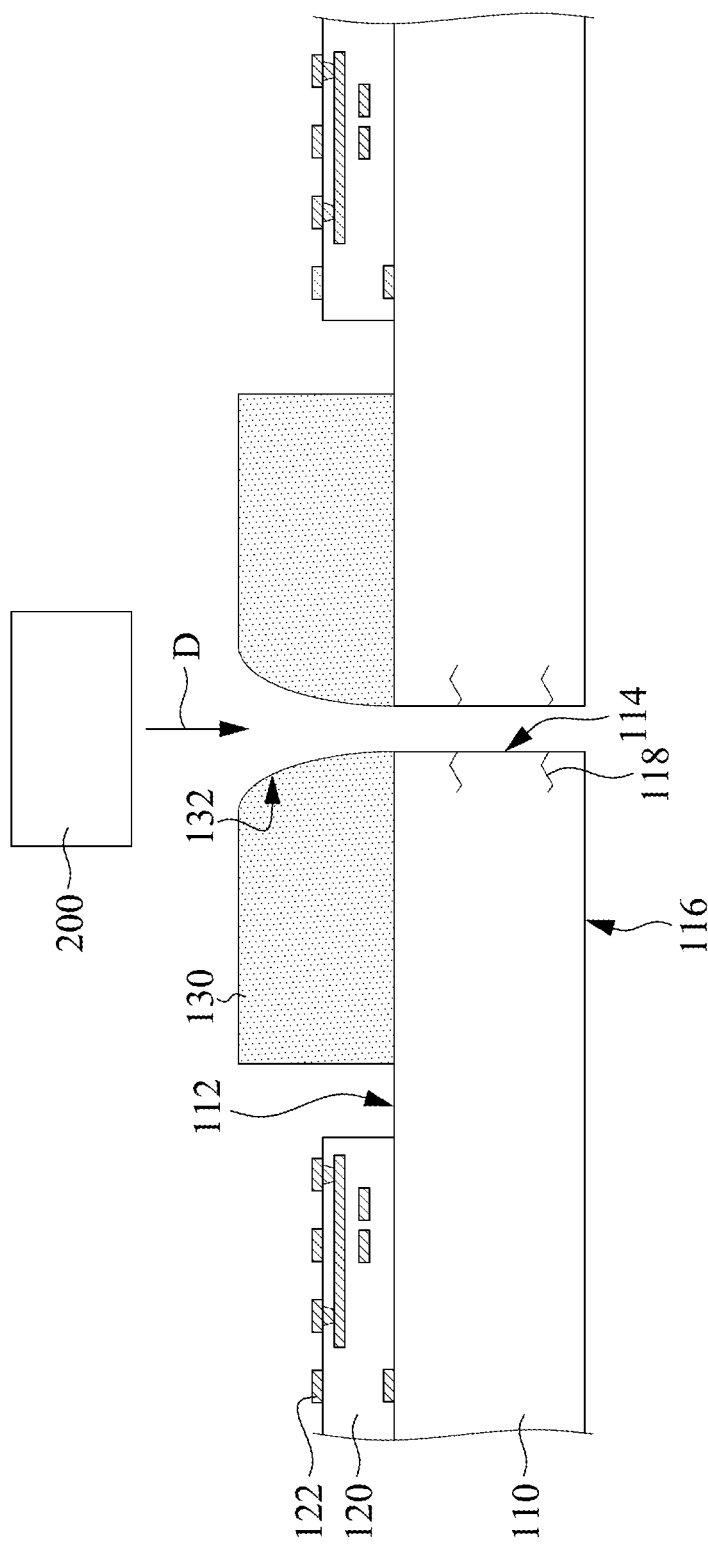
FIG. 6 illustrates a cross-sectional view at an intermediate stage of a manufacturing method of a package structure according to one embodiment of the present disclosure.

FIG. 6 illustrates a cross-sectional view at an intermediate stage of a manufacturing method of a package structure according to one embodiment of the present disclosure. Referring to FIG. 6 and back to FIG. 1, next, after the glass substrate 110 and the protective layer 130 are cut, a heat source 200 may be disposed to heat the cutting edge 132 of the protective layer 130. The heat source 200 may be located on the cutting edge 132 of the protective layer 130. After the protective layer 130 is heated by the heat source 200 along a direction D, the protective layer 130 may be transformed from a solid state to a molten state, so that a portion of the protective layer 130 may flow toward the bottom surface 116 of the glass substrate 110 to cover the cutting edge 114 of the glass substrate 110. Therefore, when the crack 118 is formed in the cutting edge 114 of the glass substrate 110, the protective layer 130 may fill the crack 118 in the cutting edge 114 of the glass substrate 110. In this way, the protective layer 130 may prevent the cracks 118 from expanding in the cutting edge 114 of the glass substrate 110, thereby enhancing a structural stability of the glass substrate 110. In addition, the crack 118 in the cutting edge 114 of the glass substrate 110 is filled with the protective layer 130, which may reduce the cracking chance of the glass substrate 110 and improve a yield of display products.

Next, after a portion of the protective layer 130 covers the cutting edge 114 of the glass substrate 110, the manufacturing method further includes removing the heat source 200 above the glass substrate 110 to solidify the protective layer 130. In some embodiments, the glass substrate 110 may be disposed on a stage (not shown) when the glass substrate 110 is not cut. After the glass substrate 110 is cut and the protective layer 130 is heated, some samples (such as the package structure 100) may be moved onto a tray (not shown). The protective layer 130 may be changed from a molten state to a solid state after being cooled, so that the protective layer 130 may stop flowing toward the bottom surface 116 of the glass substrate 110. Next, after the cutting edge 132 of the protective layer 130 is heated and the heat source 200 is removed, the manufacturing method further includes disposing the electronic device 140 on the redistribution layer 120 to form a structure shown in FIG. 1. In addition, the electronic device 140 may be electrically connected to the pads 122 of the redistribution layer 120. In some embodiments, the protective layer 130 may be non-transparent. For example, the protective layer 130 may be black, so that the protective layer 130 may absorb light, which may reduce the reflection of external light by the glass substrate 110 and improve an image quality.

In some embodiments, when the glass substrate 110 and the protective layer 130 are cut by a laser, a temperature of the laser may be adjusted to be regarded as the heat source 200. Therefore, when the glass substrate 110 and the protective layer 130 have the cutting edge 114 and the cutting edge 132 respectively, the protective layer 130 may be heated simultaneously to transform the protective layer 130 from a solid state to a molten state to cover the cutting edge 114 of the glass substrate 110. Therefore, the crack 118 in the cutting edge 114 of the glass substrate 110 may be filled by the protective layer 130 to reduce the cracking chance of the glass substrate 110.

Figure 7A:
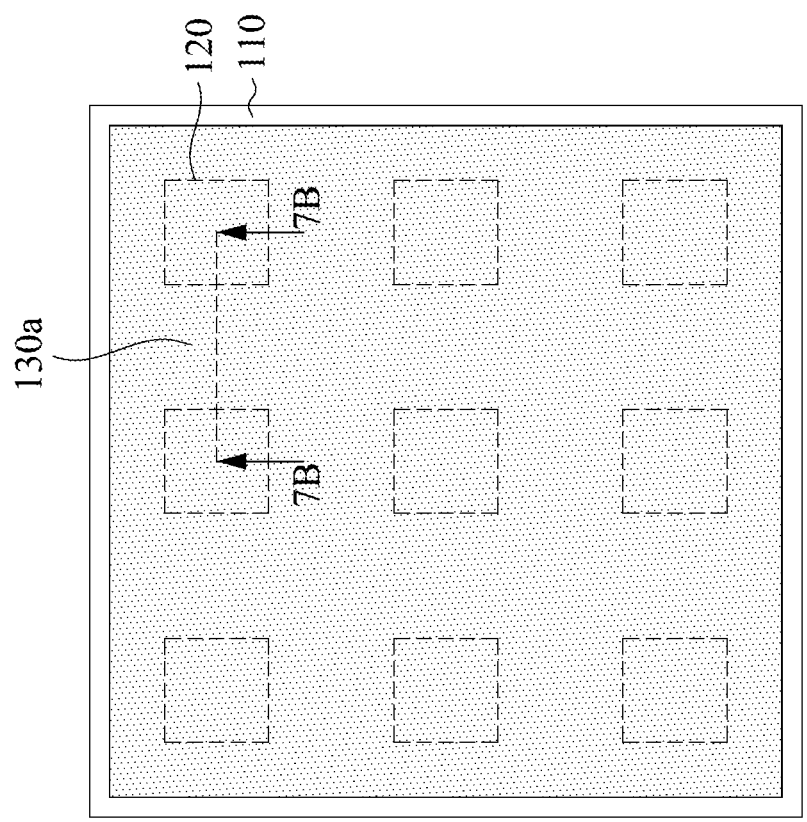
FIG. 7A illustrates a top view of a glass substrate before a cutting process is performed according to one embodiment of the present disclosure.
Figure 7B:
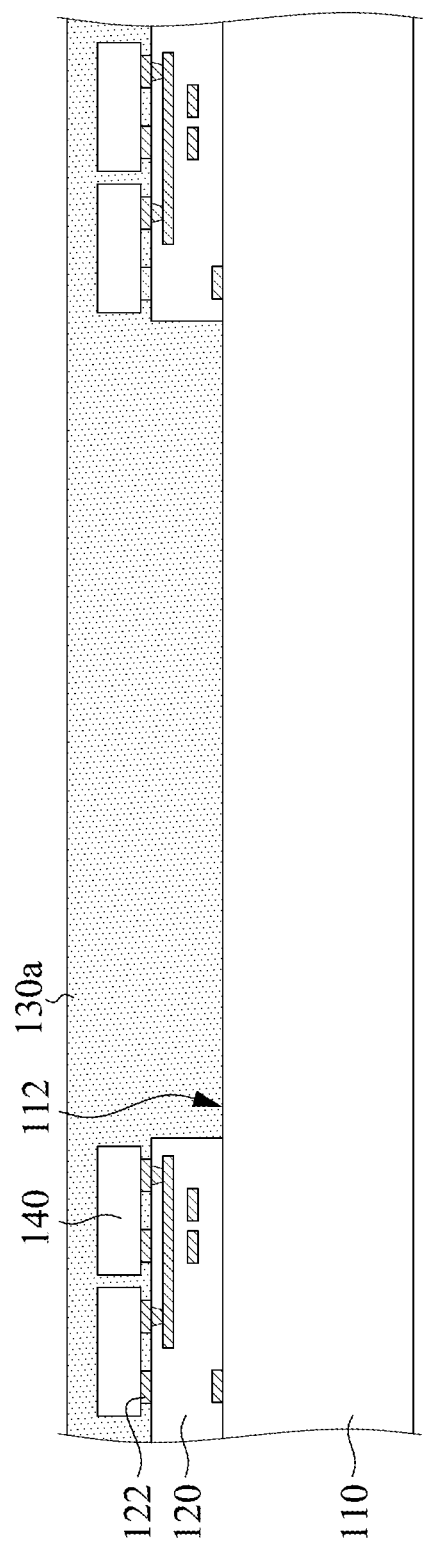
FIG. 7B illustrates a cross-sectional view of the glass substrate of FIG. 7A along line segment 7B-7B.

FIG. 7A illustrates a top view of the glass substrate 110 before a cutting process is performed according to one embodiment of the present disclosure. FIG. 7B illustrates a cross-sectional view of the glass substrate 110 of FIG. 7A along line segment 7B-7B. Referring to both FIG. 7A and FIG. 7B, the protective layer 130a is coated on the glass substrate 110 and covers the redistribution layer 120 and the electronic device 140, which may improve an overall protective effect of the protective layer 130a on the glass substrate 110. First, the redistribution layer 120 may be formed on the top surface 112 of the glass substrate 110. Next, before the protective layer 130 is formed on the top surface 112 of the glass substrate 110, the electronic device 140 may be disposed on the redistribution layer 120. The electronic device 140 may be electrically connected to the pads 122 of the redistribution layer 120. Next, after the electronic device 140 is disposed on the redistribution layer 120, the protective layer 130a may be formed on the top surface 112 of the glass substrate 110 to cover the electronic device 140. That is, the process step of disposing the electronic device 140 may be performed before the process step of forming the protective layer 130a.

Figure 8:
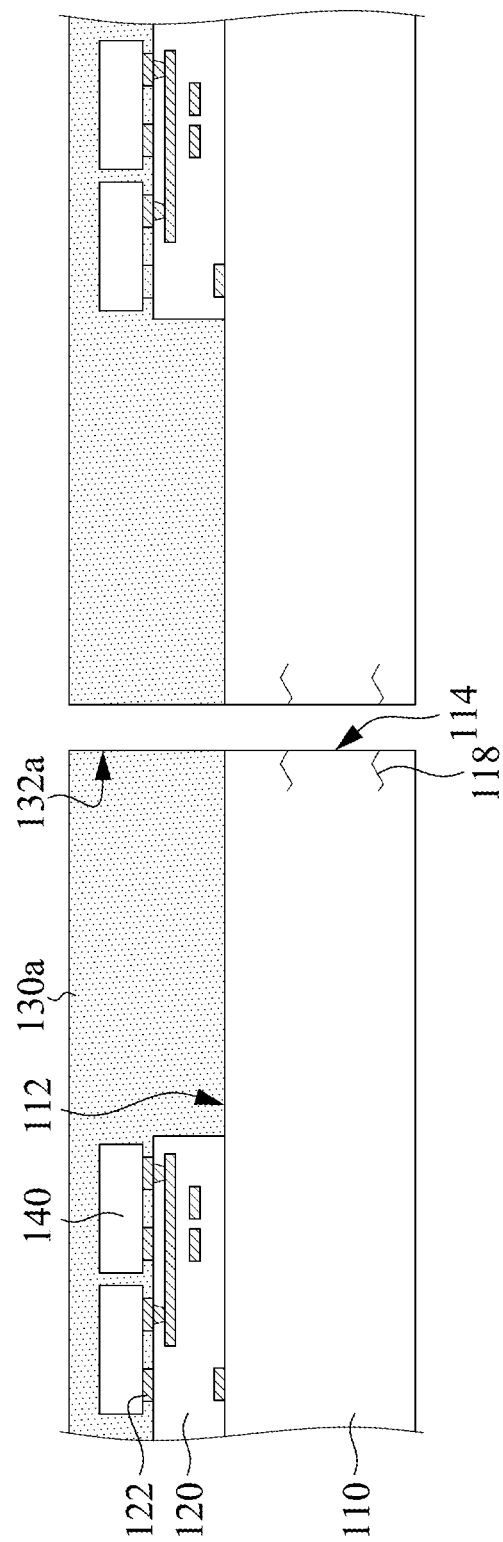
FIG. 8 and FIG. 9 are cross-sectional views at various stages of a manufacturing method of a package structure according to another embodiment of the present disclosure.
Figure 9:
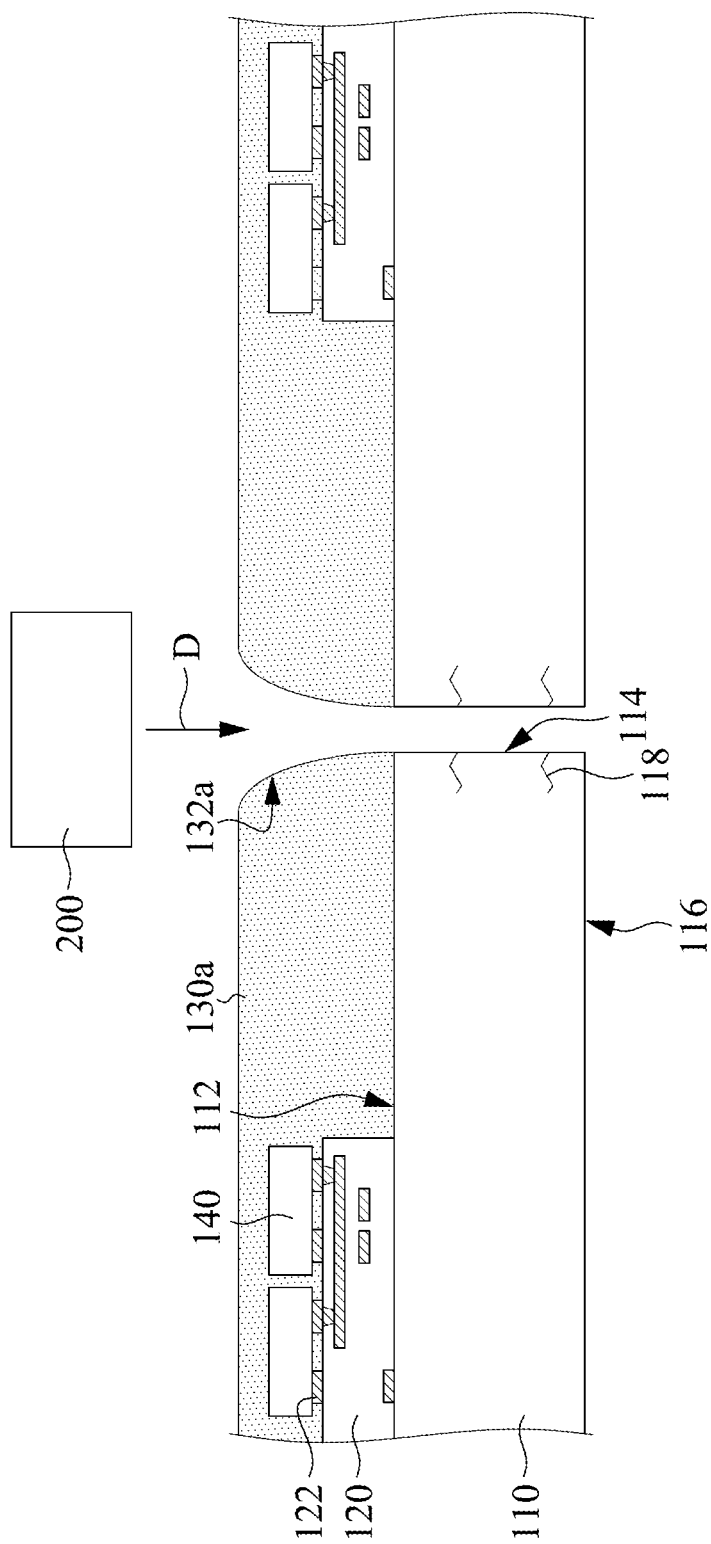

FIG. 8 and FIG. 9 are cross-sectional views at various stages of a manufacturing method of a package structure according to another embodiment of the present disclosure. Referring to FIG. 8, next, after forming the protective layer 130a on the top surface 112 of the glass substrate 110, the glass substrate 110 and the protective layer 130a may be cut so that the glass substrate 110 has the cutting edge 114 and the protective layer 130a has a cutting edge 132a. For example, when the glass substrate 110 is cut by a wheel knife or a laser, due to the glass stress or cutting parameters of the glass substrate 110, the crack 118 is formed in the cutting edge 114 of the glass substrate 110.

Referring to FIG. 9 and back to FIG. 2, next, after the glass substrate 110 and the protective layer 130a are cut, the heat source 200 may be disposed to heat the cutting edge 132a of the protective layer 130a. After the protective layer 130a is heated by the heat source 200 along the direction D, the protective layer 130a may be transformed from a solid state to a molten state, so that a portion of the protective layer 130a may flow toward the bottom surface 116 of the glass substrate 110 to cover the cutting edge 114 of the glass substrate 110. When the crack 118 is formed in the cutting edge 114 of the glass substrate 110, the protective layer 130a may fill the crack 118 in the cutting edge 114 of the glass substrate 110. Therefore, the protective layer 130a may prevent the crack 118 from expanding in the cutting edge 114 of the glass substrate 110, thereby reducing the cracking chance of the glass substrate 110 and improving a yield of the package structure 100a.

Next, after a portion of the protective layer 130a covers the cutting edge 114 of the glass substrate 110, the heat source 200 above the glass substrate 110 may be removed so that the protective layer 130a is cooled. The protective layer 130a may be transformed from a molten state to a solid state to stop flowing toward the bottom surface 116 of the glass substrate 110 to form a structure shown in FIG. 2. In some embodiments, the glass substrate 110 may be disposed on a stage (not shown) before a cutting process is performed. After the glass substrate 110 is cut and the protective layer 130a is heated, some samples (such as the package structure 100a) may be moved onto a tray (not shown). In some embodiments, the protective layer 130a is transparent. Even if the protective layer 130a extends on the redistribution layer 120 to cover the electronic device 140, the protective layer 130a may not visually block the electronic device 140, which may maintain the user's observation experience and provide a protective effect for the electronic device 140 at the same time.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
   a glass substrate having a top surface and a cutting edge adjacent to the top surface, wherein a crack is formed in the cutting edge of the glass substrate;
   a redistribution layer located on the top surface of the glass substrate;
   a protective layer located on the top surface of the glass substrate, wherein a portion of the protective layer covers the cutting edge of the glass substrate and fills the crack in the cutting edge of the glass substrate; and
   an electronic device located on the redistribution layer, wherein the protective layer extends on the redistribution layer to cover the electronic device.

2. The package structure of claim 1, wherein the redistribution layer and the protective layer are separated by a distance.

3. The package structure of claim 2, wherein the distance is in a range from 0.5 mm to 1 mm.

4. The package structure of claim 1, wherein the protective layer is made of a material that includes an organic polymer.

5. The package structure of claim 1, wherein the protective layer is transparent.

6. The package structure of claim 1, wherein the protective layer is non-transparent.

7. A package structure, comprising:
a glass substrate having a top surface and a cutting edge adjacent to the top surface, wherein a crack is formed in the cutting edge of the glass substrate;
a redistribution layer located on the top surface of the glass substrate; and
a protective layer located on the top surface of the glass substrate, wherein a portion of the protective layer covers the cutting edge of the glass substrate and fills the crack in the cutting edge of the glass substrate, wherein the protective layer is transparent.

* * * * *